US007247977B2

(12) United States Patent
Goodson

(10) Patent No.: US 7,247,977 B2
(45) Date of Patent: Jul. 24, 2007

(54) ULTRASONIC PROCESSING METHOD AND APPARATUS WITH MULTIPLE FREQUENCY TRANSDUCERS

(76) Inventor: J. Michael Goodson, 92 Rolling Hill Rd., Skillman, NJ (US) 08558

( * ) Notice: Subject to any disclaimer, the term of this patent is extended or adjusted under 35 U.S.C. 154(b) by 259 days.

(21) Appl. No.: 10/983,183

(22) Filed: Nov. 5, 2004

(65) Prior Publication Data

US 2005/0122003 A1 Jun. 9, 2005

Related U.S. Application Data

(60) Provisional application No. 60/517,501, filed on Nov. 5, 2003.

(51) Int. Cl.
*H04R 17/00* (2006.01)
*B08B 3/12* (2006.01)
*H01L 41/00* (2006.01)

(52) U.S. Cl. ........................................ 310/334; 134/1.3

(58) Field of Classification Search ................ 310/334; 134/1.3
See application file for complete search history.

(56) References Cited

U.S. PATENT DOCUMENTS

| | | | | | |
|---|---|---|---|---|---|
| 3,371,233 | A | | 2/1968 | Cook | 310/8.1 |
| 3,575,383 | A | | 4/1971 | Coleman | 259/72 |
| 4,118,649 | A | | 10/1978 | Shwartzman et al. | 310/337 |
| 4,233,477 | A | * | 11/1980 | Rice et al. | 310/334 |
| 4,527,901 | A | | 7/1985 | Cook | 366/127 |
| 5,133,376 | A | * | 7/1992 | Samarin et al. | 134/184 |
| 5,247,954 | A | * | 9/1993 | Grant et al. | 134/1 |
| 5,656,095 | A | | 8/1997 | Honda et al. | 134/1 |
| 5,865,199 | A | | 2/1999 | Pedziwiatr et al. | 134/184 |
| 6,019,852 | A | | 2/2000 | Pedziwiatr et al. | 134/1 |
| 6,150,753 | A | * | 11/2000 | DeCastro | 310/334 |

FOREIGN PATENT DOCUMENTS

| | | | | |
|---|---|---|---|---|
| GB | 1 488 252 | | | 10/1977 |
| JP | 2-34923 | | | 5/1990 |
| JP | 09199464 | A | * | 7/1997 |
| JP | 10052669 | A | * | 2/1998 |

* cited by examiner

*Primary Examiner*—Darren Schuberg
*Assistant Examiner*—J. Aguirrechea
(74) *Attorney, Agent, or Firm*—Kirkpatrick & Lockhart Preston Gates Ellis

(57) ABSTRACT

Ultrasonic processing apparatus and methods are disclosed, which includes multiple transducers of at least two different resonant frequencies supplying ultrasonic energy to a liquid filled tank containing components to be cleaned or processed ultrasonically. The transducers are arranged in equilateral triangular patterns along diagonal lines on a wall of the tank so that each transducer has an adjacent transducer of a different frequency. Alternatively, the apparatus includes one or more rod transducers having different resonant frequencies so that the apparatus provides a mixture of various frequencies of ultrasonic energy to the tank. Another aspect of the invention involves selecting transducers with different resonant frequencies that are outside an excluded subrange, and powering the transducers by a driving signal that sweeps through the resonant frequencies of the transducers and the excluded subrange.

12 Claims, 3 Drawing Sheets

ULTRASONIC PROCESSING METHOD AND APPARATUS WITH MULTIPLE FREQUENCY TRANSDUCERS

RELATED APPLICATION

This application claims priority from U.S. Provisional Application No. 60/517,501, filed Nov. 5, 2003, entitled ULTRASONIC PROCESSING METHOD AND APPARATUS WITH MULTIPLE FREQUENCY TRANSDUCERS, invented by J. Michael Goodson and Sebastian K. Thottathel. This provisional application is expressly incorporated herein by reference.

BACKGROUND OF THE INVENTION

1. Field of the Invention

This invention relates generally to ultrasonic cleaning and liquid processing methods and apparatus and other uses involving two or more piezoelectric transducers, and relates more particularly to improving performance by using ultrasonic energy at multiple frequencies.

2. Description of the Relevant Art

Ultrasonic devices are used in a variety of processes, including cleaning, emulsifying, and dispersing components or parts in a liquid medium, and other applications such as metal welding, plastic joining, and wire bonding. All these devices and processes use ultrasonic transducers to supply ultrasonic frequency sound waves to a liquid or solid medium.

Cleaning parts in a liquid medium is one common use of ultrasonics. Cleaning with ultrasonics uses ultrasonic waves to generate and distribute cavitation implosions in a liquid medium. The released energies reach and penetrate deep into crevices, blind holes and areas that are inaccessible to other cleaning methods.

Ultrasonic waves are -pressure waves formed by actuating the ultrasonic transducers with high frequency, high voltage current generated by electronic oscillators (typically referred to as power supplies or generators). A typical industrial high power generator produces ultrasonic frequencies ranging from 20 to 300 kHz or more. Ultrasonic transducers typically include piezoelectric (PZT) devices that expand and contract when subjected to the oscillating driving signals supplied by generators. The transducers are normally mounted on the bottom and/or the sides of the cleaning tanks or immersed in the liquid. The generated ultrasonic waves propagate perpendicularly to the resonating surface. The waves interact with liquid media to generate cavitation implosions. High intensity ultrasonic waves create micro vapor/vacuum bubbles in the liquid medium, which grow to maximum sizes proportional to the applied ultrasonic frequency and then implode, releasing their energies. The higher the frequency, the smaller the cavitation size.

The energy released from an implosion in close vicinity to the surface collides with and fragments or disintegrates the contaminants, allowing the detergent or the cleaning solvent to displace it. The implosion also produces dynamic pressure waves which carry the fragments away from the surface. The cumulative effect of millions of continuous tiny implosions in a liquid medium is what provides the necessary mechanical energy to break physically bonded contaminants, speed up the hydrolysis of chemically bonded ones and enhance the solubilization of ionic contaminants.

In general, at low frequencies (20–30 kHz), a relatively smaller number of cavitations with larger sizes and more energy are generated. At higher frequencies, much denser cavitations with moderate or lower energies are formed. Low frequencies are more appropriate for cleaning heavy and large-size components, while higher frequency (60–80 kHz) ultrasonics is recommended for cleaning delicate surfaces and for the rinsing step.

In some applications it is advantageous to use multiple transducers operating at different frequencies in combination. See, for example, U.S. Pat. No. 6,019,852 and U.K. Patent 1,488,252. These patents disclose cleaning apparatus with rectangular grids of two different frequency transducers, separately driven by two power supplies or generators.

SUMMARY OF THE INVENTION

One aspect of the present invention is an ultrasonic processing apparatus and method having multiple transducers of at least two different resonant frequencies supplying ultrasonic energy to a liquid filled tank containing components to be cleaned or processed ultrasonically. The transducers are preferably of a stacked construction and are arranged in equilateral triangular patterns along diagonal lines on the bottom wall or side walls of the tank so that each transducer has an adjacent transducer of a different frequency.

A second aspect of the present invention is an ultrasonic processing apparatus and method having one or more rod transducers (push-pull or single-push types) with ultrasonic converters or transducers mounted on one or both ends and installed in a liquid-filled tank containing components to be cleaned or processed ultrasonically. The rod transducers have different resonant frequencies so that the apparatus provides a mixture of various frequencies of ultrasonic energy to the tank.

A third aspect of the present invention is an ultrasonic processing apparatus and method having multiple transducers or piezoelectric crystals with different resonant frequencies and a generator or power supply that powers the transducers or piezoelectric crystals operating throughout a frequency range that spans the different resonant frequencies. Preferably, the transducers or piezoelectric crystals are paired together and have at least a minimum difference in resonant frequencies. In other words, within the frequency range of driving signals supplied by the generator, there is a predetermined subrange in which none of the transducers or piezoelectric crystals have a resonant frequency.

These aspects of the present invention provide, either individually or in combination, an improved performance ultrasonic cleaning and liquid processing method and apparatus.

The features and advantages described in the specification are not all inclusive, and particularly, many additional features and advantages will be apparent to one of ordinary skill in the art in view of the drawings, specification and claims hereof. Moreover, it should be noted that the language used in the specification has been principally selected for readability and instructional purposes, and may not have been selected to delineate or circumscribe the inventive subject matter, resort to the claims being necessary to determine such inventive subject matter. For example, the specification uses the terms transducer, converter, and piezoelectric crystals to refer to devices that generates ultrasonic vibrations in response to an electrical driving signal. Also, the term resonant frequency includes a fundamental harmonic frequency of a transducer or piezoelectric crystal, and also includes higher order harmonics.

DETAILED DESCRIPTION OF THE PREFERRED EMBODIMENTS

The drawings depict various preferred embodiments of the present invention for purposes of illustration only. One skilled in the art will readily recognize from the following discussion that alternative embodiments of the structures and methods illustrated herein may be employed without departing from the principles of the invention described herein.

A first aspect of the present invention, illustrated in FIGS. 1–4, involves the placement of multiple transducers of two or three different operating or resonant frequencies that supply ultrasonic energy to a liquid filled tank containing parts to be cleaned ultrasonically. The transducers are preferably of a stacked construction and are arranged along diagonal lines in an equilateral triangular pattern on a bottom or side wall of the tank.

Figure 1:
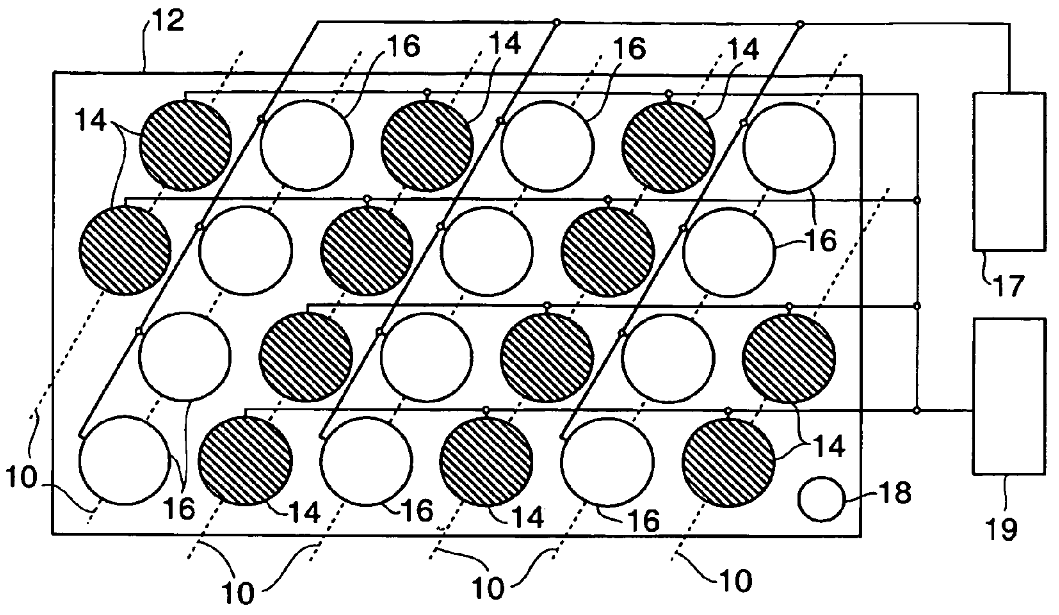
FIG. 1 is a view of an arrangement of two types of ultrasonic transducers on a tank wall according to one embodiment of the present invention.

One arrangement of transducers is shown in FIG. 1. The view is of the bottom wall 12 of a tank or vessel used for ultrasonic cleaning or other ultrasonic liquid processing, although this arrangement can also be used on one or more side walls of a tank. Two types or groups of transducers, 14 (represented by dark circles) and 16 (represented by open circles), each having a different operating or resonant frequency, are arranged in an equilateral triangular pattern along diagonal lines 10. Each transducer has at least two adjacent transducers in positions that form an equilateral triangle, and at least one of those adjacent transducers has a different frequency. Each diagonal line 10 has transducers of the same type, either 14 or 16. This arrangement provides efficient packing density of the transducers, with the two types equally interspersed across the bottom of the tank. The tank or vessel is made of ceramic, metal, metal alloys, glass, quartz, Pyrex, plastics or other suitable non-porous material. A drain hole 18 is provided at a corner of the bottom wall 12. The transducers 14 and 16 may be mounted underneath the tank to the outside surface of the tank bottom, or may be affixed to an immersible radiating surface or plate and placed inside the tank, or mounted to a transducer plate that is affixed to the bottom of the tank. The frequencies are preferably within the range of 10 KHz to 3000 KHz. Preferably, there are equal numbers of transducers of each frequency. In this embodiment, there are a total of twenty-four transducers, including twelve of each frequency.

Figure 2:
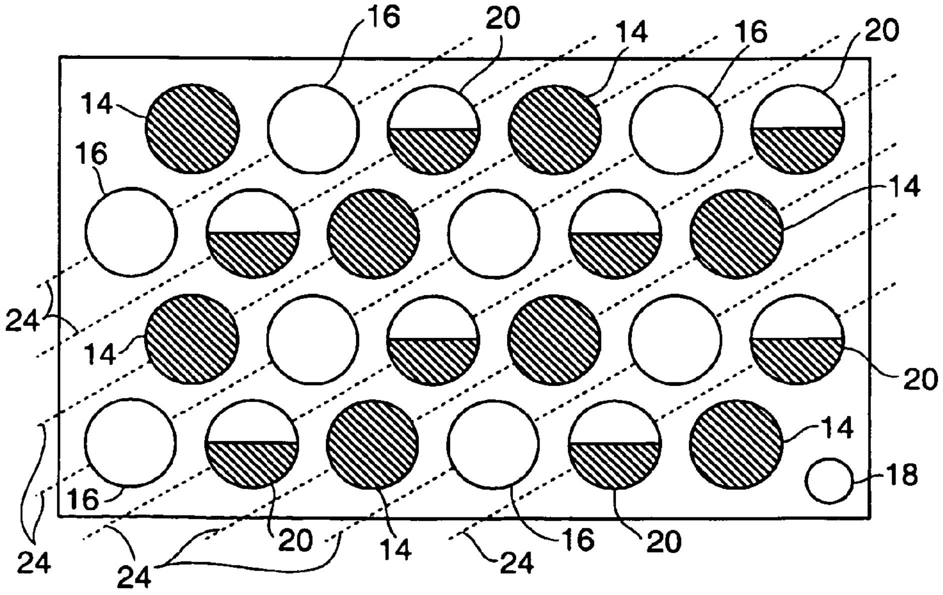
FIG. 2 is a view of an arrangement of three types of ultrasonic transducers on a tank wall according to another embodiment of the present invention.

Another arrangement of transducers is shown in FIG. 2. Three types or groups of transducers, 14 (represented by dark circles), 16 (represented by open circles), and 20 (represented by half dark circles), each having a different operating or resonant frequency, are arranged in an equilateral triangular pattern along diagonal lines 24. Each equilateral triangle has three associated transducers 14, 16, and 20, one of each type. Transducers of the same type are not adjacent to each other because they are separated by transducers of the other types. This arrangement provides efficient packing density of the transducers, with the three transducer types interspersed across the bottom of the tank. Each transducer has at least two adjacent transducers of different frequencies. Preferably, there are equal numbers of transducers of each frequency, which is eight of each transducer 14, 16, and 20 in this embodiment.

Figure 3:
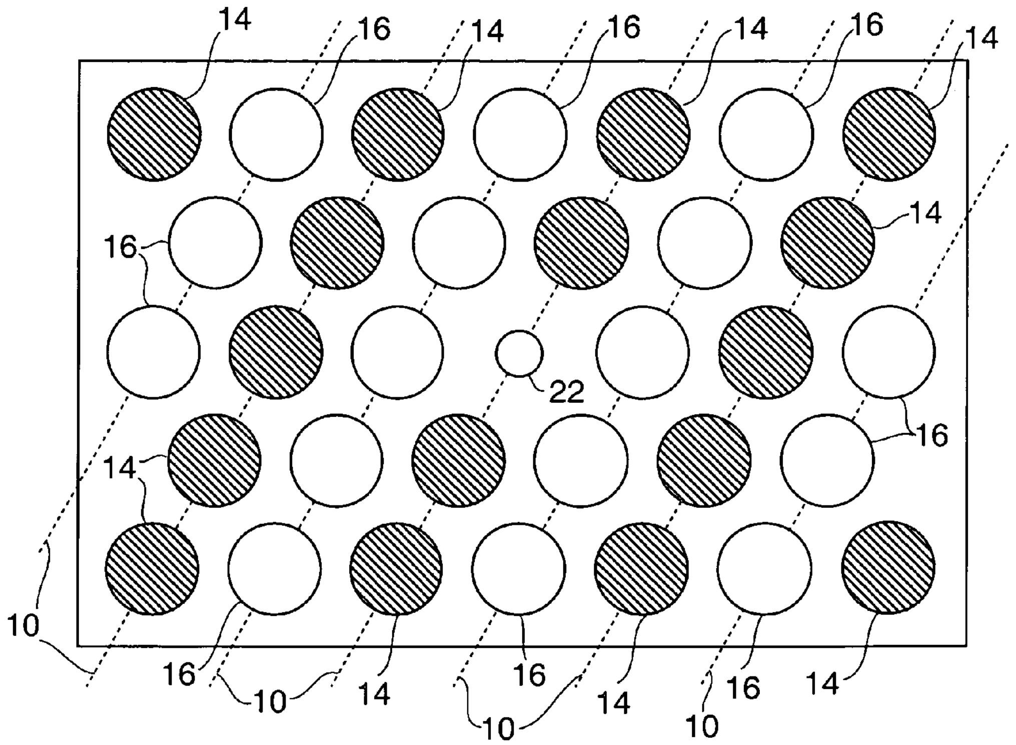
FIG. 3 is a view of an arrangement of two types of ultrasonic transducers and a center drain according to another embodiment of the present invention.

A third arrangement of transducers is shown in FIG. 3, which is an arrangement like that of FIG. 1, but the drain 22 is in the center and there are thirty-two total transducers 14 and 16, sixteen of each frequency.

Figure 4:
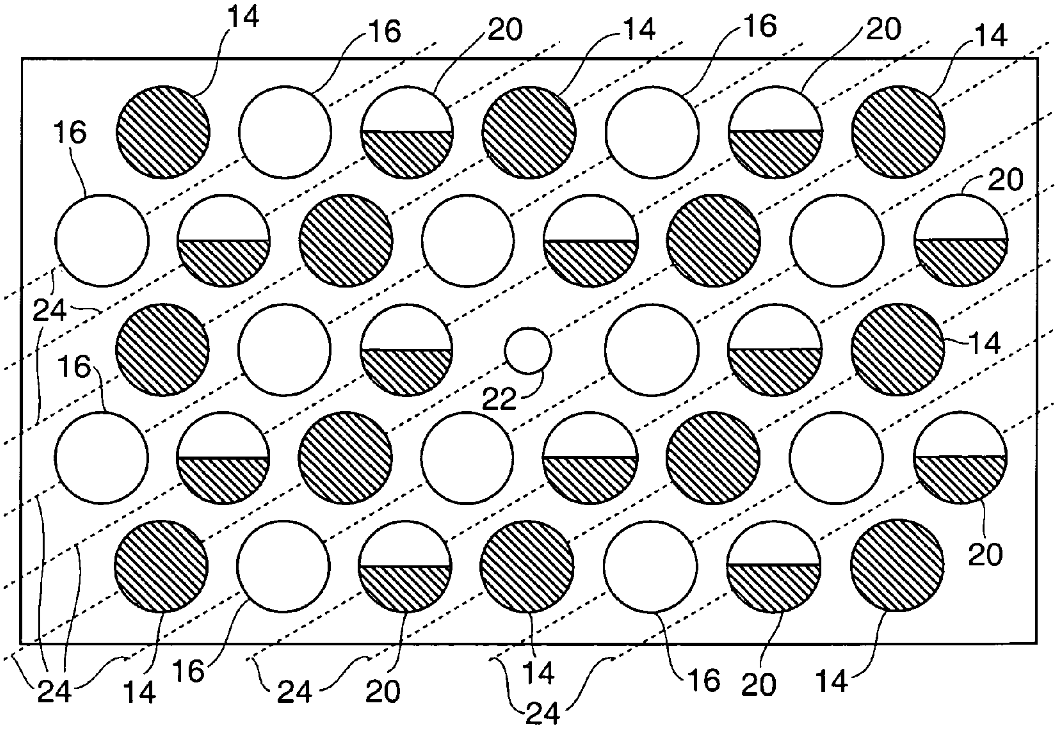
FIG. 4 is a view of an arrangement of three types of ultrasonic transducers and a center drain according to another embodiment of the present invention.

Another arrangement of three types of transducers 14, 16, and 20 is shown in FIG. 4. This is an arrangement similar to that of FIG. 2, but the drain 22 is in the center and there are thirty-six total transducers, twelve of each frequency.

The different operating or resonant frequencies of the transducers are preferably selected so that the lowest frequency does not damage the parts being cleaned and the higher or highest frequency optimally removes smaller particulates or rinses off debris loosened by the lower frequency. It is preferred that all transducers of each type are powered by a separate generator 17 or 19 (FIG. 1) that supplies a driving signal at a resonant frequency of those transducers. Alternatively, all transducers may be powered by one generator that switches from frequency to frequency or sweeps throughout a range of frequencies that includes the resonant frequencies of the transducers.

Figure 5:
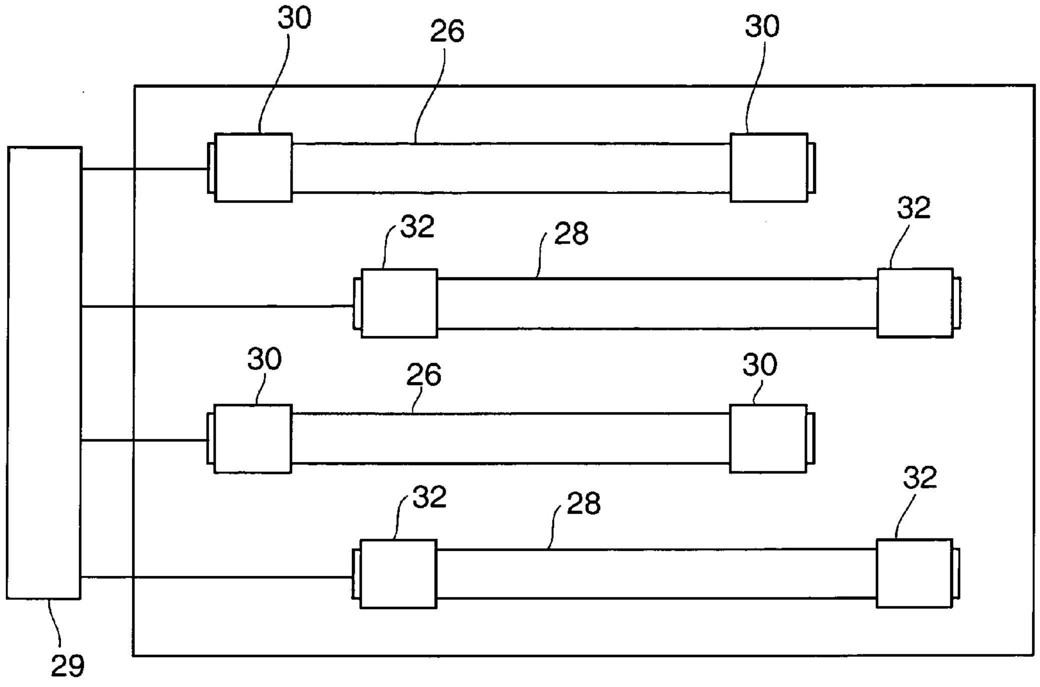
FIG. 5 is a view of the arrangement of two types of rod transducers on a tank wall according to another embodiment of the present invention.

A second aspect of the present invention includes multiple rod transducers (push-pull or single-push types) having ultrasonic converters mounted on one or both ends. FIG. 5 shows four push-pull rod transducers 26 and 28 mounted to the inside of a wall of a tank. The rod transducers 26 and 28 may be mounted horizontally on the bottom wall of the tank, or vertically or horizontally on one or more side walls of the tank. The rod transducers 26 and 28 are immersed in a liquid-filled tank containing components or parts to be cleaned or processed ultrasonically. Preferably, the rod transducers 26 and 28 have different resonant frequencies so that the apparatus provides various frequencies of ultrasonic energy to the liquid in the tank. The rods are composed of metal, glass, ceramic, quartz, or other suitable material. Titanium construction, for example, permits the use of a wide range of cleaning media including CFC solvents, hydrocarbons, aqueous alkalline solutions, aqueous neutral solutions, and some aqueous acid solutions. The rod transducers 26 and 28 are powered by a generator 29 that supplies ultrasonic frequency driving signals to the transducers. The generator may provide driving signals at different frequencies to rod transducers having different resonant frequencies, or a sweeping or alternating frequency driving signal that includes all the resonant frequencies of the rod transducers.

The rod transducers 26 and 28, also known as push-pulls or single-push transducers, have ultrasonic converters 30 and 32 mounted in end caps on one or both ends. Two or more rod transducers, each with a different resonant frequency, are used to create a superior cleaning or liquid processing process. Alternatively, two or more frequencies are provided by the same transducer rod by intermittently or simultaneously switching the frequencies of the driving signals.

Another way to obtain multiple frequencies using one push-pull transducer is to drive one converter at one end at one frequency and the other converter at the other end at a different frequency. Preferably, the rods used in the rod transducers are sized so that they resonate at the desired multiple frequencies. For example, if the half wavelength of one frequency is five inches and the half wavelength of the other frequency is seven inches, then a rod of thirty-five inches will resonate at both frequencies. Another way to obtain multiple frequencies from one push-pull transducer is to set one frequency to be an integer multiple of the other frequency.

Multiple frequencies may also be obtained by a single-push rod transducer by sizing the rod transducer for multiple resonant frequencies, and using an alternating driving signal that alternates between the two frequencies.

A third aspect of the present invention involves sweeping the driving signal applied to the transducers throughout a range of frequencies. This aspect of the invention can be applied to multiple piezoelectric (PZT) crystals within a single transducer or to multiple transducers used in the same system. In either case, either the piezoelectric crystals or transducers are selected to have different resonant frequencies that are different by at least a minimum amount.

For example, assume that the sweep frequency range is 39 to 41 KHz, and that the minimum differential is 0.5 KHz centered in the range. That means that each pair of transducers or piezoelectric crystals has one with a resonant frequency of between 39 and 39.75 KHz and another with a resonant frequency of between 40.25 and 41 KHz. None of the transducers or piezoelectric crystals in this example have a resonant frequency in the excluded subrange of 39.75 to 40.25 KHz.

Figure 6:
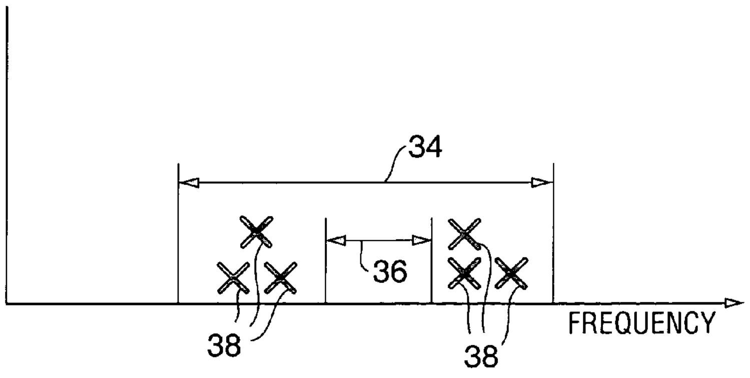
FIG. 6 is a diagram of frequency ranges relevant to an embodiment of the present invention.

This aspect of the invention is illustrated in FIG. 6. The entire frequency range swept by the generator is frequency range 34, and the excluded subrange that contains none of the transducer resonant frequencies is frequency subrange 36. The resonant frequency of each transducer or piezoelectric crystal is represented by an X 38. There are no X's (resonant frequencies) in the excluded subrange 36. The boundaries of the excluded subrange 36 define the minimum differential of the resonant frequencies of the transducers or piezoelectric crystals. Preferably, the excluded subrange 36 is between 10% and 25% of the entire frequency range 34 swept by the generator.

According to this third aspect of the invention, the piezoelectric crystals or transducers are manufactured with the desired differential and only those piezoelectric crystals or transducers that meet the predetermined criteria are used. The resonant frequencies may be determined by testing the transducers or piezoelectric crystals and selecting them according to the test results.

This aspect of the invention applies to an ultrasonic cleaning or liquid processing process wherein the predetermined resonant frequency differential (excluded subrange) and the sweep frequency range are selected according to the application. This aspect of the invention may also be applied to metal welding, plastic joining, wire bonding and/or other medical or manufacturing processes using ultrasonics. Furthermore, this aspect of the invention may be used with an equilateral arrangement of stacked transducers of different frequencies or with push-pull or single-push transducers of different frequencies, as described above.

From the above description, it will be apparent that the invention disclosed herein provides a novel and advantageous ultrasonic processing apparatus and method using multiple transducers of at different frequencies to supply ultrasonic energy to a liquid filled tank containing components to be cleaned or processed ultrasonically. The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

What is claimed is:

1. An ultrasonic processing apparatus comprising:

a tank operable for containing a fluid;

multiple ultrasonic transducers coupled to the tank and operable for supplying ultrasonic energy to the fluid in the tank, wherein a first group of the transducers has a first resonant frequency, wherein a second group of the transducers has a second resonant frequency that is different from the first resonant frequency, wherein a third group of the transducers has a third resonant frequency that is different from the first and second resonant frequencies, and wherein the transducers are arranged in an equilateral triangular pattern along diagonal lines so that each transducer has at least two adjacent transducers having different resonant frequencies; and a generator means for supplying driving signals to the transducers.

2. An apparatus as recited in claim 1, wherein the generator means includes a generator coupled to each group of transducers, wherein each generator supplies a driving signal at the resonant frequency of its associated group of transducers.

3. An ultrasonic processing apparatus comprising:

multiple ultrasonic devices operable for supplying ultrasonic energy, wherein a first group of the ultrasonic devices has a first resonant frequency and a second group of the ultrasonic devices has a second resonant frequency that is different from the first resonant frequency, and wherein there is an excluded subrange between the first and second resonant frequencies in which none of the ultrasonic devices has a resonant frequency; and a generator for supplying a driving signal to the ultrasonic devices, wherein the driving signal varies in frequency throughout a range that includes the excluded subrange and the resonant frequencies of the ultrasonic devices.

4. An apparatus as recited in claim 3, wherein the excluded subrange is between 10% and 25% of the frequency range of the driving signal.

5. An apparatus as recited in claim 3, wherein the ultrasonic devices are piezoelectric crystals.

6. An apparatus as recited in claim 3, wherein the ultrasonic devices are transducers.

7. An apparatus as recited in claim 6, further comprising a tank operable for containing a fluid, wherein multiple ultrasonic transducers are coupled to the tank and operable for supplying ultrasonic energy to the fluid in the tank, and wherein the transducers are arranged in an equilateral triangular pattern along diagonal lines so that each transducer has at least two adjacent transducers and at least one adjacent transducer has a different resonant frequency.

8. An apparatus as recited in claim 6, further comprising a tank operable for containing a fluid and wherein the transducers include a first group of transducers having a first resonant frequency, a second group of transducers having a second resonant frequency that is different from the first resonant frequency, and a third group of transducers having a third resonant frequency that is different from the first and second resonant frequencies, wherein the transducers are coupled to the tank and operable for supplying ultrasonic energy to the fluid in the tank, and wherein the transducers are arranged in an equilateral triangular pattern along diagonal lines so that each transducer has at least two adjacent transducers having different resonant frequencies.

9. An apparatus as recited in claim 6, further comprising a tank operable for containing a fluid, wherein the transducers are rod transducers coupled to the tank and operable for supplying ultrasonic energy to the fluid in the tank.

10. An apparatus as recited in claim 6, further comprising a tank operable for containing a fluid, wherein the transducers are rod transducers coupled to the tank and operable for supplying ultrasonic energy to the fluid in the tank, wherein each rod transducer has an ultrasonic converter located at each end of a rod, wherein the two ultrasonic converters on each rod transducer have different resonant frequencies, and wherein the rod transducer resonates at both resonant frequencies.

11. An ultrasonic processing method comprising the steps of:

providing multiple ultrasonic devices operable for supplying ultrasonic energy, wherein a first group of the ultrasonic devices has a first resonant frequency and a second group of the ultrasonic devices has a second resonant frequency that is different from the first resonant frequency, and wherein there is an excluded subrange between the first and second resonant frequencies in which none of the ultrasonic devices has a resonant frequency; and supplying a driving signal to the ultrasonic devices, wherein the driving signal varies in frequency throughout a range that includes the excluded subrange and the resonant frequencies of the ultrasonic devices.

12. A method as recited in claim 11, wherein the excluded subrange is between 10% and 25% of the frequency range of the driving signal.

* * * * *